United States Patent
Datta et al.

(10) Patent No.: US 7,868,794 B2
(45) Date of Patent: Jan. 11, 2011

(54) METHODS AND APPARATUS TO TEST AND COMPENSATE MULTI-CHANNEL DIGITAL-TO-ANALOG CONVERTERS

(75) Inventors: Ramyanshu Datta, Dallas, TX (US); Christopher Michael Barr, Plano, TX (US); Alessandro Paglieri, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 68 days.

(21) Appl. No.: 12/345,230

(22) Filed: Dec. 29, 2008

(65) Prior Publication Data

US 2010/0164762 A1 Jul. 1, 2010

(51) Int. Cl.
*H03M 1/10* (2006.01)
(52) U.S. Cl. ........................ 341/118; 341/144
(58) Field of Classification Search ................. 341/118, 341/120, 144
See application file for complete search history.

(56) References Cited

U.S. PATENT DOCUMENTS

| | | | |
|---|---|---|---|
| 6,667,703 B1 * | 12/2003 | Reuveni et al. | 341/120 |
| 7,079,064 B1 * | 7/2006 | Bell et al. | 341/144 |
| 2005/0157815 A1 * | 7/2005 | Kim et al. | 375/302 |
| 2006/0250288 A1 * | 11/2006 | Fernandez et al. | 341/120 |
| 2009/0128382 A1 * | 5/2009 | Matsukawa et al. | 341/120 |

FOREIGN PATENT DOCUMENTS

JP 06021816 A * 1/1994

OTHER PUBLICATIONS

Burns et al., "An Introduction to Mixed-Signal IC Test and Measurement," Chapter 9, pp. 315-320 and 350-364, Oxford University Press, New York, New York, 2001.
Arabi et al., "On Chip Testing Data Converters Using Static Parameters," IEEE Transactions on Very Large Scale Integration (VLSI) Systems, vol. 6, No. 3, Sep. 1998, pp. 409-419.

\* cited by examiner

*Primary Examiner*—Howard Williams
(74) *Attorney, Agent, or Firm*—John J. Patti; Wade J. Brady, III; Frederick J. Telecky, Jr.

(57) ABSTRACT

Methods and apparatus to test and compensate multi-channel digital-to-analog converters (DACs) are described. In some examples, a multi-channel digital-to-analog converter (DAC) and an error detector are implemented in an integrated circuit. The multi-channel DAC includes a first DAC channel configured to generate a first analog representation of a digital input signal, and a second DAC channel configured to generate a second analog representation of the digital input signal. The error detector is configured to compare the first analog representation and the second analog representation to generate a difference signal, and to output a signal indicative of whether the difference signal is greater than a predetermined threshold.

19 Claims, 4 Drawing Sheets

… (US 7,868,794 B2)

METHODS AND APPARATUS TO TEST AND COMPENSATE MULTI-CHANNEL DIGITAL-TO-ANALOG CONVERTERS

FIELD OF THE DISCLOSURE

This disclosure relates generally to digital-to-analog converters and, more particularly, to methods and apparatus to test and compensate multi-channel digital-to-analog converters.

BACKGROUND

In large-scale manufacturing of digital-to-analog converters (DACs), integrated circuits having DACs are typically tested for compliance against design specifications. Some tests apply a signal to the DACs and monitor the outputs using expensive testing equipment, such as highly-calibrated testing DACs. The testing equipment, long test times, and limited multi-site testing capability contribute to high test costs.

A traditional test technique includes measuring the output voltage of the DAC under test for each of multiple digital input codes. The input codes may take the form of a digital ramp wave to measure intrinsic parameters of the DAC such as integral non-linearity, differential non-linearity, gain, and offset. The input codes may also take the form of a digital sine wave to measure transmission parameters such as signal-to-noise ratio, total harmonic distortion, and spurious free dynamic range. The testing equipment digitizes the output voltage of the DAC under test, performs a Fast Fourier Transform (FFT) on the digitized signal, and calculates the test parameters from the FFT. If the DAC under test does not meet minimum performance requirements, the DAC, or the part including the DAC, is discarded. Discarding parts reduces the yield from a manufacturing lot and increases associated costs. Therefore, discarding parts is to be avoided as much as possible.

SUMMARY

Methods and apparatus to test and compensate multi-channel digital-to-analog converters (DACs) are described. In some examples, a multi-channel digital-to-analog converter (DAC) and an error detector are implemented in an integrated circuit. The multi-channel DAC includes a first DAC channel configured to generate a first analog representation of a digital input signal, and a second DAC channel configured to generate a second analog representation of the digital input signal. The error detector is configured to compare the first analog representation and the second analog representation to generate a difference signal, and to output a signal indicative of whether the difference signal is greater than a predetermined threshold.

DETAILED DESCRIPTION

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof. Accordingly, while the following describes example methods and apparatus, persons of ordinary skill in the art will readily appreciate that the examples are not the only way to implement such methods and apparatus.

The example methods and apparatus described herein may be used to quickly and efficiently test multi-channel digital-to-analog converters (DACs) during production. In some examples, ICs having multi-channel DACs are provided with on-chip error detectors. A first DAC channel A and a second DAC channel B have a pre-defined phase relationship for a given input signal. The example error detector compensates for the differences between channels A and B, and determines if the compensated channel outputs are within a tolerance. The error detector outputs a one-bit signal to indicate if the channel outputs are acceptable. The signal bit may be read by a simple testing device external to the IC, and the IC is considered acceptable or unacceptable based on the signal bit.

In other example methods and apparatus, a digital signal processor (DSP) generates digital test signals as inputs to the DAC channels A and B and monitors the output of the error detector. If the error detector indicates the DAC channels A and B do not have the proper phase relationship, the DSP adjusts the input signal to one or both of the channels (e.g., channel B) until the error detector indicates the phase relationship is acceptable. The DSP then stores the phase adjustment so the IC having a compensated phase relationship may be used instead of being discarded.

Figure 1:
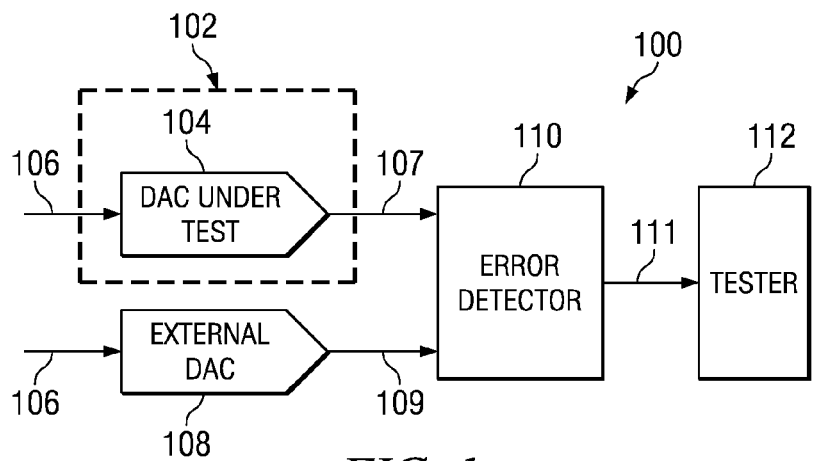
FIG. 1 is a block diagram of a typical test arrangement.

FIG. 1 is a block diagram of a typical test arrangement 100. Such test arrangements may occur in a production facility to determine whether ICs including multi-channel DACs perform within engineering specifications. The test arrangement 100 of FIG. 1 includes an IC 102 having a DAC 104 to be tested. The DAC 104 receives a digital test signal 106 or series of digital test signals and generates an analog representation of the digital test signal 107. The test arrangement 100 also includes a reference DAC 108 that receives the same digital test signal 106 that the DAC 104 receives, and generates a reference analog representation of the digital test signal 109.

The reference DAC 108 must be calibrated often to maintain high accuracy in measurements.

An error amplifier 110 external to the IC 102 compares the output signals from the DAC 104 and the reference DAC 108 and outputs an error signal 111 to a tester 112. The tester 112 then determines whether the error signal 111 (i.e., the difference between the output signals) is greater than a specified tolerance. If the difference between the DAC outputs 107 and 109 is too great, the IC 102 is typically discarded, resulting in high production overhead costs. In addition, the above-described testing process is slow for large numbers of ICs, due to the complexity (i.e., cost) of the testing equipment required.

Figure 2:
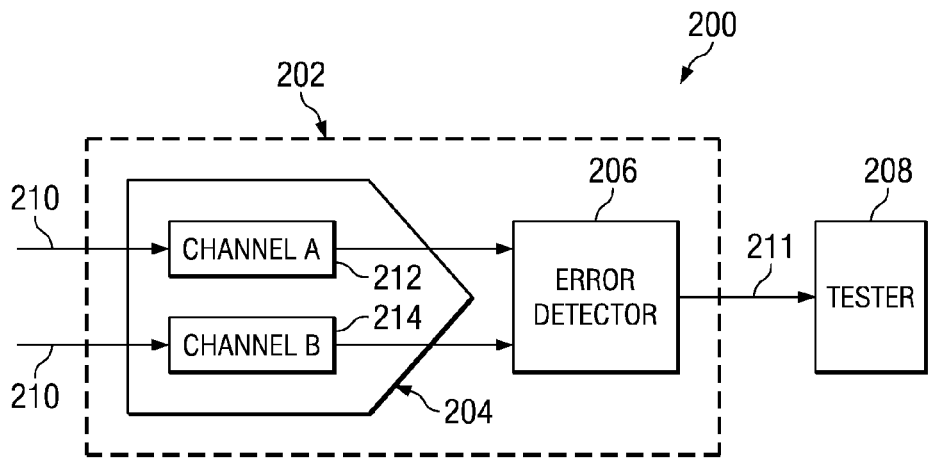
FIG. 2 is a block diagram of an example integrated circuit provided with a multi-channel digital-to-analog converter and an error detector in an example test arrangement.

FIG. 2 is a block diagram of an example IC 202 provided with a multi-channel DAC 204 and an error detector 206 in an example test arrangement 200. The example test arrangement 200 may be implemented to test large numbers of ICs 202 using relatively inexpensive testers 208. For example, a single tester 208 may be used to test large quantities of identical, substantially identical, similar, or varied ICs 202.

In the example test arrangement 200, the DAC 204 is stimulated by applying one or more identical digital codes 210 to each of two DAC channels A 212 and B 214. Multiple digital codes 210 may be applied, and the digital codes 210 may take the form of, for example, a digitized sine wave, a digitized ramp wave, a digitized triangle wave, or other useful digital code patterns.

During manufacturing, the DAC design generated by the circuit designer is transferred to the silicon of the IC, and any number of manufacturing flaws, material defects, and/or random occurrences can affect the final manufactured IC. The goal of testing is to catch these defects. If the manufactured IC (e.g., the IC 202) is substantially different than the designed circuit, the example DAC channels A 212 and B 214 may not have the magnitude or phase relationship that the circuit designer intended. That is, if the DAC channels A 212 and B 214 are designed to have, for example, a 180° phase offset, random irregularities in the manufacturing material may cause the realized phase offset to be 179°. By comparing the example DAC channels A 212 and B 214 on the same manufactured IC 202, a testing device can detect if either of the DAC channels A 212 or B 214 has a faulty output without the use of an additional DAC such as, for example, the reference DAC 108 of FIG. 1.

The test arrangement 200 may be configured to test the behavior of the example DAC 204 for a direct current (DC) stimulus by applying a digitized ramp wave to the DAC channels A 212 and B 214. The digitized ramp wave comprises a series of digital codes 210 that are applied one at a time to each channel 212 and 214 of the DAC 204. For each digital code 210, the DAC channels A 212 and B 214 each output an analog representation of the digital code 210 to the error detector 206. The error detector 206 compares the analog representations. If the error detector 206 determines the amplitude difference between the analog representations of the digital code 210 is within a pre-determined tolerance, the error detector 206 indicates the example DAC 204 is acceptable by setting a flag 211 (i.e., a one-bit signal) readable by the tester 208. However, if the error detector 206 detects a difference between the analog representations that is greater than the tolerance, the error detector 206 sets the flag 211 to indicate to the tester 208 that the DAC 204 is faulty. The error detector 206 iterates the process for each digital code 210.

The example DAC channels A 212 and B 214 also have a pre-defined phase relationship that is determined by a circuit designer. To determine whether the DAC channels A 212 and B 214 have the correct phase relationship, the test arrangement 200 may apply digital codes 210 representing a digitized sine wave to both DAC channels A 212 and B 214. In some example cases, the DAC channel B 214 has a consistent phase offset relative to the DAC channel A 212. The error detector 206 is designed to compensate one or both of the DAC channel outputs to compensate for the phase offset and compare the compensated outputs. For example, if the DAC channel B 214 has a 180° phase offset relative to the DAC channel A 212, the error detector 206 compensates for the DAC channel B 214 output and then compares the compensated output magnitudes to the output of the DAC channel A 212 for a given input code. If one of the DAC channels A 212 or B 214 outputs the wrong value for an input code (i.e., the subject channel has an error), the difference between the DAC channel A 212 output and the compensated output will be greater than a pre-determined tolerance, and the error detector 206 indicates the example DAC 204 is faulty by setting a one-bit signal 211 (e.g., a logic 1) that is readable by the tester 208. In contrast, if the difference is within the pre-determined tolerance, the error detector 206 outputs the one-bit signal 211 to the tester 208 (e.g., a logic 0) to indicate the example DAC 204 is within specifications.

By implementing the error detector 206 on the IC 202, a circuit designer may customize the error detector 206 for the particular phase relationship of the DAC channels A 212 and B 214. The error detectors 206 are also generally more accurate when built into the IC 202, while requiring little additional die area within the IC 202. Additionally, the one-bit output of the error detector 206 allows simple, inexpensive testers 208 to test many ICs rapidly by reading one bit of data from each of many ICs 202 at once.

The example DAC 204 of FIG. 2 receives digital codes 210 from an external stimulus device. However, the IC 202 may include an additional device to generate the digital codes 210 for testing purposes. Additionally or alternatively, the digital codes 210 may be generated to simulate waves having different phases, in which case the digital codes 210 are not always equal. Generating the digital codes 210 to simulate waves having different phases may be used to test the phase relationship between the DAC channels A 212 and B 214, which may reduce or eliminate the phase compensation required by the error detector 206.

Figure 3:
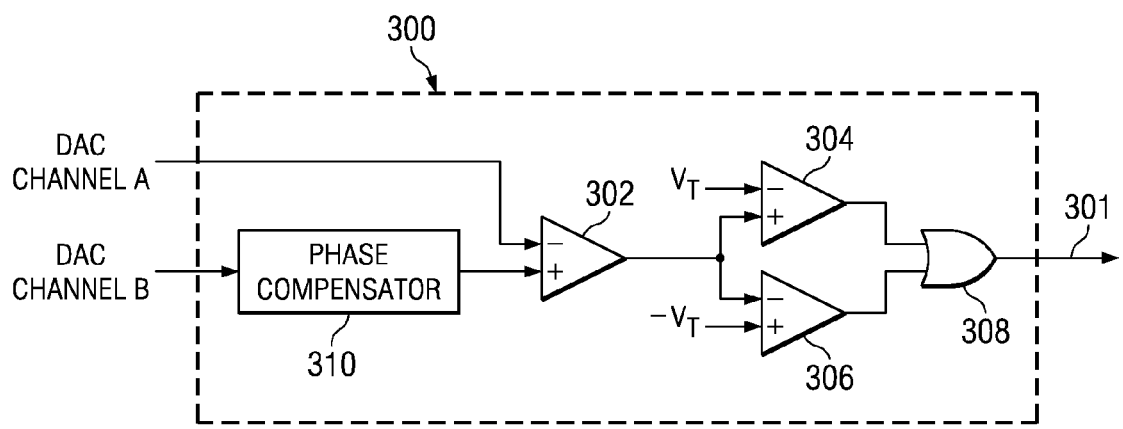
FIG. 3 is a schematic diagram of an example error detector that may be used to implement the error detector shown in FIG. 2.

FIG. 3 is a schematic diagram of an example error detector 300 that may be used to implement the error detector 206 shown in FIG. 2. The example error detector 300 receives analog signals from the DAC channels A and B (e.g., the DAC channels A 212 and B 214 of FIG. 2), compares the analog signals, and outputs a digital flag 301 that may be read by a tester device (e.g., the tester 208 of FIG. 2). The example error detector 300 sets the flag 301 to logic 1 to indicate the DAC channels A and B are not within specifications, and sets the flag 301 to logic 0 to indicate the DAC channels A and B are acceptable.

The example error detector 300 receives analog signals from the DAC channels A and B and amplifies the difference between the signals via a differential amplifier 302. The output from the differential amplifier 302 reflects only the difference (e.g., in voltage) between the signals. The output of the differential amplifier 302 is then compared to a threshold or tolerance voltage $V_T$ using comparators 304 and 306. The threshold voltage $V_T$ reflects the maximum allowable voltage difference between the analog signals from the DAC channels A and B. The circuit designer may choose the threshold voltage $V_T$. Alternatively, the circuit designer may design the differential gain of the differential amplifier 302 such that the maximum allowable voltage difference between the DAC channels A and B multiplied by the differential gain of the differential amplifier 302 is equal to $V_T$. The comparator 304 compares the differential amplifier 302 output to $V_T$, and outputs a logical 1 if the differential amplifier 302 output (i.e., the voltage difference between the DAC channels A and B) exceeds $V_T$. Similarly, the comparator 306 compares the differential amplifier 302 output to $-V_T$, and outputs a logical 1 if the differential amplifier 302 output falls below $-V_T$. If the differential amplifier 302 output is between $V_T$ and $-V_T$, the outputs of both comparators 304 and 306 remain at 0.

The example error detector 300 further includes an OR gate 308 to monitor the outputs of the comparators 304 and 306. The output of the OR gate 308 is monitored by an external testing device. If either of the outputs of the comparators 304 or 306 is logical 1 (i.e., if the difference between the analog signals from the DAC channels A and B is greater than the tolerance), the OR gate 308 outputs a logical 1 to indicate the DAC is faulty. In contrast, if the outputs of the comparators 304 and 306 are logical 0 (i.e., the difference between the analog signals is within the tolerance), the OR gate 308 outputs a logical 0 to indicate the DAC is acceptable. If the external testing device detects a logical 1 output from the OR gate 308, the external testing device may mark the part to be discarded.

Dynamic behavior testing determines the effects on the analog output from a DAC in response to changing inputs, such as a sine wave. In contrast to previous testing systems, the example error detector 300 determines dynamic behavior of a DAC without determining complicated testing parameters (e.g., spurious dynamic free range, signal-to-noise ratio, total harmonic distortion). During dynamic behavior tests, the example error detector 300 compensates for the phase relationship between the DAC channels A and B via a phase compensator 310. The example phase compensator 310 adjusts the DAC channel B to produce a compensated output. The differential amplifier 302 then compares the analog signal from the DAC channel A to the compensated output of the phase compensator 310. The phase compensator 310 is designed by the circuit designer based on the desired phase relationship between the DAC channels A and B. Because the phase compensator 310 compensates for phase differences during dynamic behavior testing, the phase compensator 310 may be disabled or bypassed during the DC testing.

Although the example comparators 304 and 306 compare the differential amplifier 302 output to threshold voltages $V_T$ and $-V_T$, the differential amplifier 302 may also have a DC voltage offset $V_{OFF}$ at the output. If there is an offset, the comparators 304 and 306 may be modified to compare the differential amplifier 302 output to $V_{OFF}+V_T$ and $V_{OFF}-V_T$, respectively. Additionally, the threshold voltages need not be symmetrical. For example, the threshold voltages may be $+V_T$ and $-V_X$, where $V_T$ is not equal to $V_X$. The example error detector 300 may also be modified in other ways depending on the application.

Figure 4:
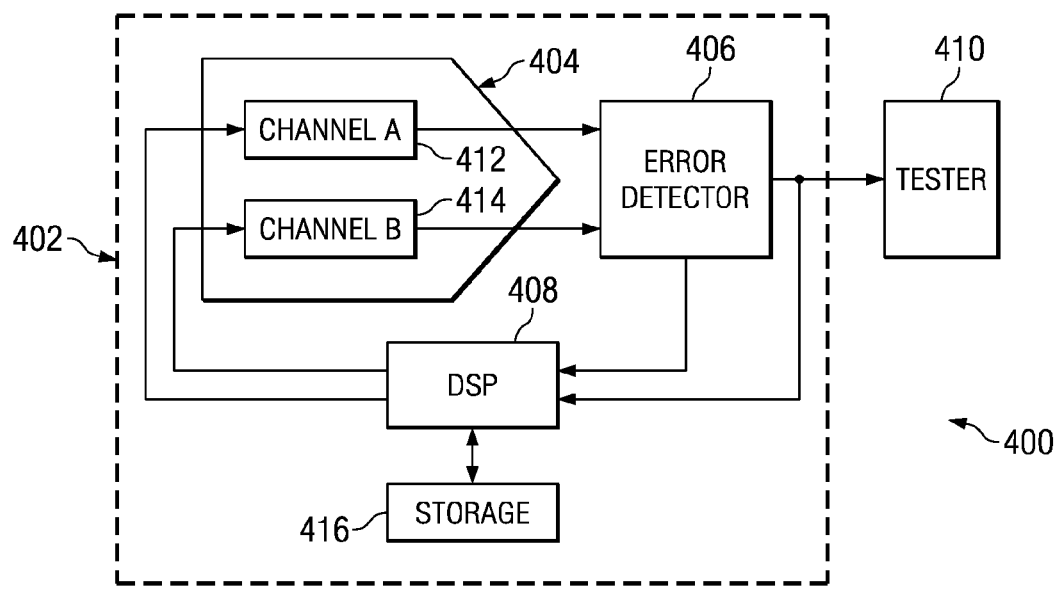
FIG. 4 is a block diagram of an example integrated circuit provided with a multi-channel digital-to-analog converter, an error detector, and a digital signal processor, in another example test arrangement.

FIG. 4 is a block diagram of an example IC 402 provided with a multi-channel DAC 404, an error detector 406, and a digital signal processor (DSP) 408, in another example test arrangement 400. In the example test arrangement 400, the IC 402 is coupled to a tester 410 and a stimulus is applied to the DAC 404. The tester 410 monitors the output of the error detector 406, which is indicative of whether the DAC 404 meets the desired specifications. If the tester 410 determines the DAC 404 is not acceptable, the DAC 404 may be discarded. However, the example IC 402 of FIG. 4 includes a DSP 408 that may be programmed to correct or compensate the DAC 404 output for some types of defects. By correcting for defects instead of discarding a defective part, the yield of a manufactured lot of ICs may be increased and manufacturing costs may be reduced.

The example DAC 404, like the example DAC 204 of FIG. 2, includes two DAC channels A 412 and B 414. During testing, the DSP 408 generates stimulus signals, such as digital codes, that are input to the DAC 404. Each of the DAC channels A 412 and B 414 converts the digital codes to analog representations and outputs the analog representations to the error detector 406. The error detector 406 determines whether the difference between the analog representations from the DAC channels A 412 and B 414 is greater than a pre-determined tolerance. If the DAC channels A 412 and B 414 output analog representations that are within the tolerance, the error detector 406 outputs a logical 0 to the tester 410 to indicate the DAC channels A 412 and B 414 are acceptable.

The DSP 408 monitors the output of the error detector 406. While the output of the error detector 406 remains at logical 0, the DSP 408 continues generating digital codes to test the DAC 404 until the test is complete. However, if the error detector 406 outputs a logical 1 to indicate the DAC 404 is faulty, the DSP 408 may attempt to compensate the input stimulus to determine the phase offset between the DAC channel A 412 and the DAC channel B 414. The DSP 408 will generally only attempt to determine the phase offset during the dynamic behavior testing, because during DC testing there is generally no phase difference between the DAC channels A 412 and B 414.

To determine the phase offset of the DAC channels A 412 and B 414, the example DSP 408 generates a second test signal that has a phase offset from the test signal that was applied to both DAC channels. As a result, the DSP 408 applies the original test signal to one channel (e.g., channel A 412) and applies the second test signal to the other channel (e.g., channel B 414). The DSP 408 monitors the output of the error detector 406 while applying the phase-offset test signals. If the error detector 406 determines the DAC channels A 412 and B 414 are not yet within the tolerance, the error detector 406 continues to output a logical 1. The DSP 408 then incrementally adjusts the phase offset of the test signals in response to the error detector 406 output and applies the new test signals to the DAC channels A 412 and B 414. The DSP 408 and error detector 406 continue to adjust the phase offset and monitor the DAC channel outputs until the DAC channels A 412 and B 414 are equal, substantially equal, or within tolerance. When the error detector 406 and DSP 408 determine the correct phase offset, the DSP 408 may store the phase offset in a storage block 416 for use in tuning the corresponding DAC channel A 412 or B 414 during normal operation to ensure accurate operation of the DAC 404. Example storage devices that may be used to implement the storage block 416 include non-volatile or volatile memory, such as random-access memory (RAM), read-only memory (ROM), flash-based memory, or any other type of suitable storage device. The storage block 416 may be external to the DSP 408 or included in the DSP 408.

While a one-bit output from the error detector 406 may be sufficient for pass/fail or during DC testing of the DAC 404, one bit may be too coarse for tuning via the DSP 408. One bit may be used, but the DSP 408 may need to adjust the phase offset for channel B in one direction (e.g., increasing the phase of the input test signal to channel B relative to the original test signal), and then adjust the phase offset for channel B in the opposite direction (e.g., decreasing the phase of the input test signal to channel B relative to the original test signal) if adjusting the phase offset in the first direction does not determine the phase offset. In contrast, if the error detector 406 outputs a multi-bit signal or an analog signal, the DSP 408 may determine the phase offset more quickly. For example, the error detector 406 may output a first bit to indicate whether the DAC 404 is acceptable and output a second bit to indicate in which direction the phase is offset if the DAC 404 is unacceptable. The DSP 408 may then detect the first and second bits to adjust the phase offset of the test signals in the correct direction. In another example, the error detector 406 may output a one-bit signal indicate whether the DAC 404 is acceptable, and output an analog difference signal (e.g., the difference signal from the error detector 202 of FIG. 2). The DSP 408 may then quickly adjust the phase offset by monitoring the analog difference signal and adjusting based on the polarity and magnitude of the analog signal.

In some examples, the DSP 408 first provides the input signals (e.g., digitized sine waves) to the DAC 404 at a low frequency. After determining and/or compensating the phase relationship between the channels A 412 and B 414, the DSP 408 applies the same type of input signals at a higher frequency. If the DSP 408 compensated for the phase relationship during the low frequency testing, the DSP 408 applies the compensation to the high frequency testing. If the high frequency testing then results in another phase mismatch, the tester 410 may determine the failure is due to a timing violation instead of a phase mismatch. Timing violations cannot be compensated by adjusting the inputs via the DSP 408 and, thus, the IC 402 must be discarded. Testing the DAC 404 at multiple frequencies assists the tester 410 in determining the cause of phase mismatches between the DAC channels A 412 and B 414.

Figure 5:
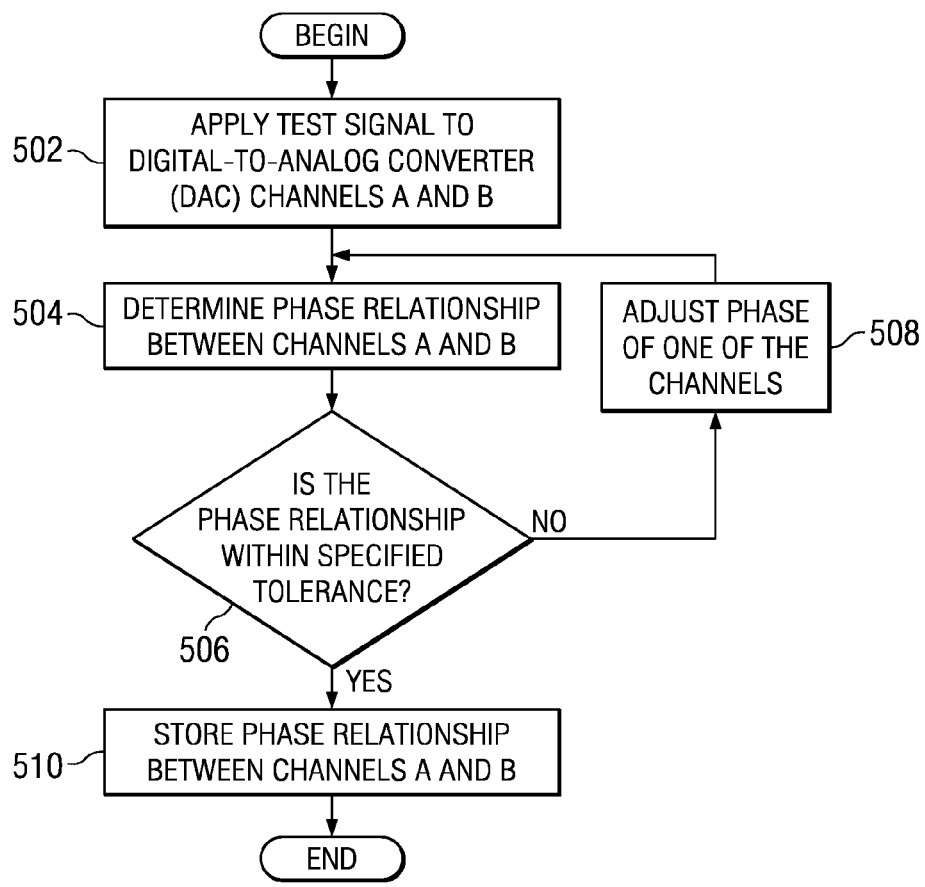
FIG. 5 is a flowchart illustrating an example method to test and compensate multi-channel digital-to-analog converters.

FIG. 5 is a flowchart illustrating an example method 500 to test and compensate multi-channel DACs. The example method 500 may be used to test large numbers of manufactured ICs quickly and inexpensively. In addition to testing, the method 500 attempts to compensate for potentially faulty DACs by adjusting the phase relationship between the channels within each multi-channel DAC. The example method 500 may be implemented using the example test arrangement 400 illustrated in FIG. 4.

The example method begins by applying a test signal to two channels in a multi-channel DAC (block 502). In this example, the DAC includes two channels A and B. The test signal represents a digitized sine wave and includes a number digital input codes to represent the sine wave. While the test signal is being applied to the DAC, an error detector (e.g., the error detector 406 of FIG. 4) determines the phase relationship between channels A and B (block 504). In some examples, the error detector 406 of FIG. 4 determines the phase relationship by analyzing analog signals, which are generated by the DAC channels A and B in response to the applied test signals. The error detector 406 may adjust one or both of the analog signals, depending on the desired phase relationship between channels A and B, before comparing the signals.

The error detector 406 then determines if any phase relationship (e.g., voltage difference) between the channels A and B is within a tolerance or threshold (block 506). If the phase relationship is not within the tolerance, a DSP or other processing unit (e.g., the DSP 408 of FIG. 4) attempts to adjust the phase of one of the channels A or B (block 508). Because the example blocks 504-508 are potentially iterative, the DSP 408 may adjust the example channel B first, and then adjust the example channel A in other iterations if adjustments to channel B do not correct the phase relationship. For example, if the DSP 408 is generating the test signals for input to the DAC during testing, the DSP 408 may trim (i.e., tune, adjust) the input phase so the test signal to channel A is no longer equal to the test signal to channel B. The DSP 408 may incrementally adjust the phase and test after each incremental change to achieve an accurate phase relationship. To aid in adjusting the channels, the error detector 406 may determine in which direction the phase relationship is offset during block 504 and provide this information to the DSP 408 via, for example, an analog signal or a digital flag. After adjusting one of the channels (block 508), control returns to block 504 to determine the phase relationship between channels A and B. As mentioned above, blocks 504-508 may iterate until block 506 determines the phase relationship between channels A and B is within the tolerance.

If the error detector 406 determines the phase difference between channels A and B is within the tolerance (block 506), the DSP 408 stores the phase relationship between channels A and B in a storage device (e.g., storage 416 of FIG. 4) (block 510). If the phase relationship between channels A and B has not been adjusted at block 508, storing the phase relationship may be omitted. However, if the DSP 408 has adjusted the test signal to either channel A or channel B, the DSP 408 may store the respective adjustment for use during normal operation of the DAC. By determining the phase relationship, the DSP 408 may be able to correct for a phase mismatch during normal operation and prevent the need to discard the IC.

Figure 6:
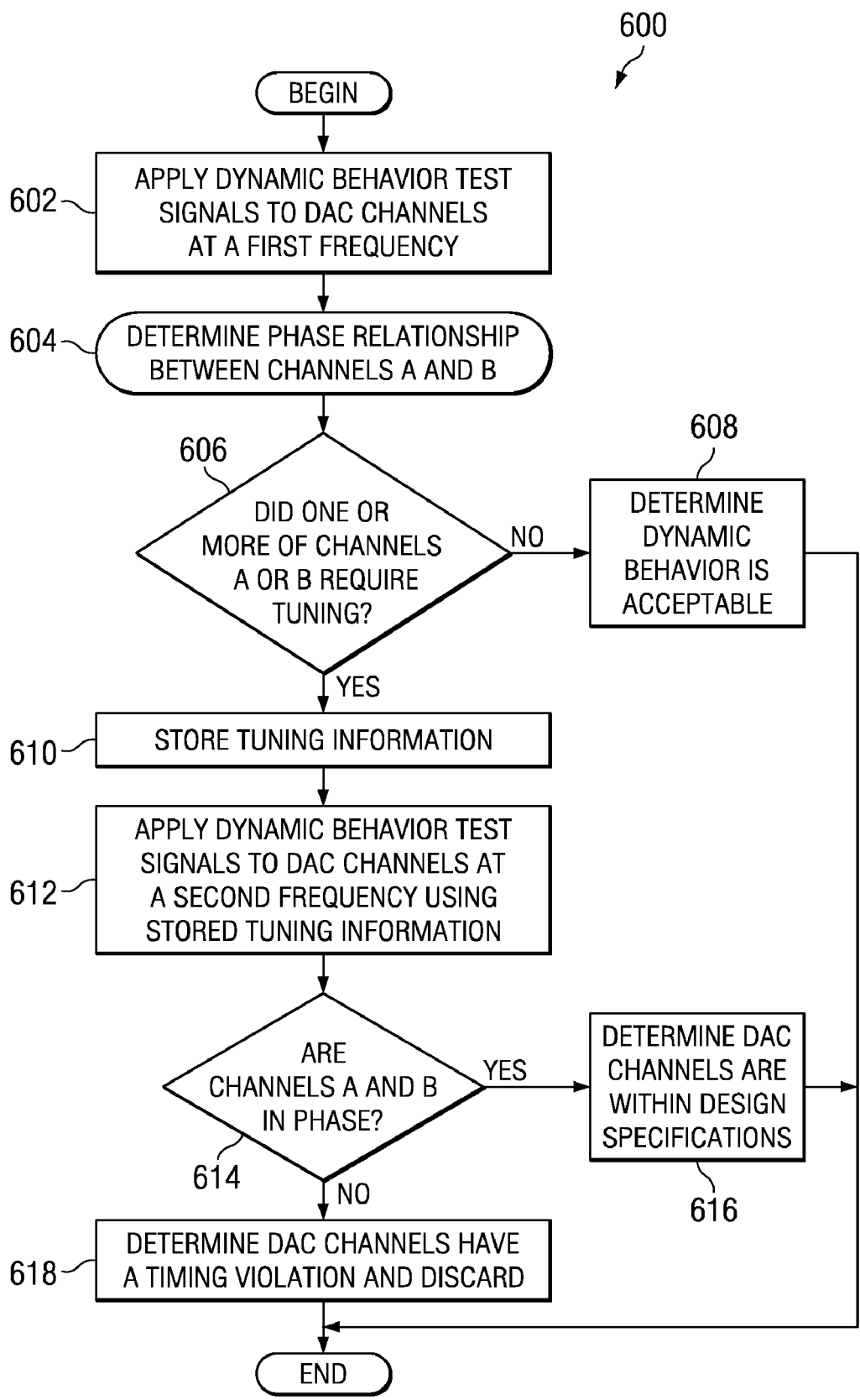
FIG. 6 is a flowchart illustrating an example method to test and compensate multi-channel digital-to-analog converters using multiple test frequencies.

FIG. 6 is a flowchart illustrating an example method 600 to test and compensate multi-channel DACs using multiple test frequencies. The example method 600 may be used to test multi-channel DACs during manufacturing by testing the dynamic behavior of a DAC (e.g., the example DAC 404 of FIG. 4) at a first frequency and a second frequency. The example method 600 method begins by applying (e.g., via the DSP 408 shown in FIG. 4) dynamic behavior test signals at a first frequency to the DAC 404 channels (e.g., the channels A 412 and B 414 of FIG. 4) under test (block 602). An error detector (e.g., the error detector 406 of FIG. 4) and/or the DSP 408 determine the phase relationship between channels A 412 and B 414 (block 604). The example block 604 may be implemented using, for example, the method 500 illustrated in FIG. 5. If neither of the channels A 412 or B 414 required tuning (block 606), the error detector 406 and/or the DSP 408 determines the example DAC 404 has acceptable dynamic behavior (block 608).

If one or more of the channels A 412 or B 414 requires tuning (block 606), the example DSP 408 stores information indicative of the tuning (e.g., in the storage block 416 of FIG. 4) (block 610). The DSP 408 then applies dynamic behavior test signals to the DAC channels A 412 and B 414 at a second frequency, using the tuning information stored in the storage block 416 (block 612). The error detector 406 and/or the DSP 408 determine whether the channels A 412 and B 414 are in phase at the second frequency (block 614). If the channels A 412 and B 414 are in phase at the second frequency (block 614), the DSP 408 may determine the DAC channels A 412 and B 414 are within design specifications (block 616). However, if the channels A 412 and B 414 are not in phase at the second frequency while using the stored tuning information (block 614), the DSP 408 may determine the DAC channels A 412 and B 414 have a timing violation, and signal for the part to be discarded (block 618). Timing violations are not correctable via the tuning methods described. After determining the dynamic behavior of the DAC 404 at the first and second frequencies, the example method 600 may end.

Figure 7:
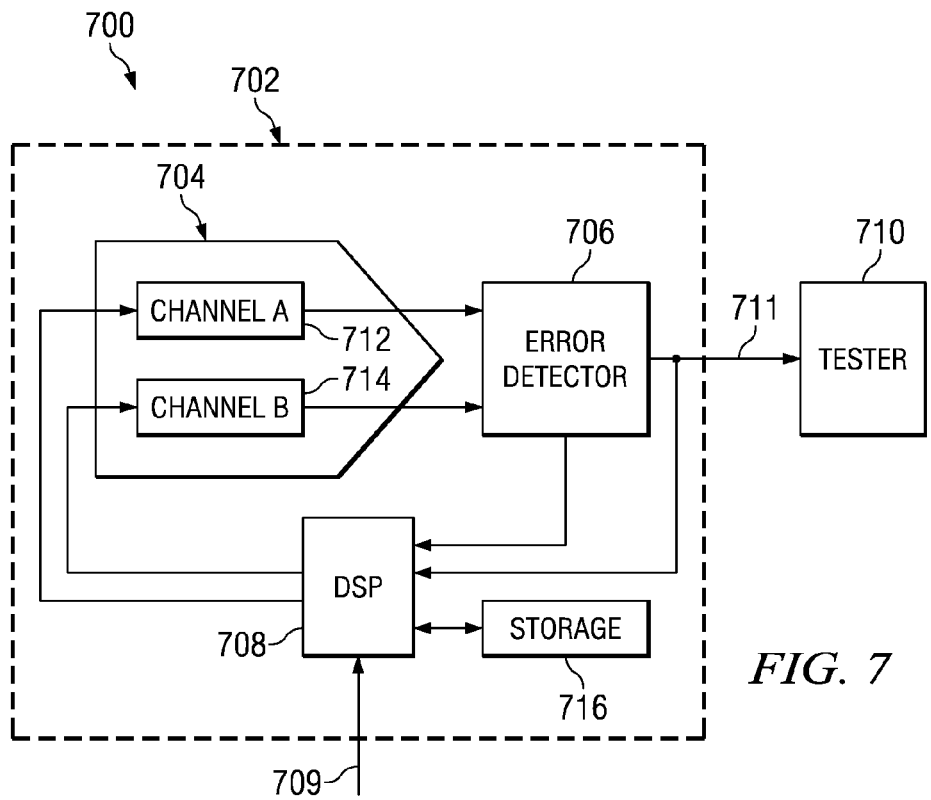
FIG. 7 is a block diagram of an example integrated circuit provided with a multi-channel digital-to-analog converter, an error detector, and a digital signal processor, implemented in an example customer application.

FIG. 7 is a block diagram of an example IC 702 provided with a multi-channel DAC 704, an error detector 706, and a digital signal processor 708, implemented in an example customer application 700. The example IC 702 may be implemented in the customer application 700 after being tested during manufacturing using the example methods described above. The example IC 702 corresponds the example IC 402 described in FIG. 4, and includes similar or identical components, such as a multi-channel DAC 704 having two channels A 712 and B 714, an error detector 706, a DSP 708, and a storage device 716.

When a customer implements the example IC 702 into, for example, a consumer, commercial, or industrial product, the customer may want to perform testing during the product design process. Additionally or alternatively, the end user of the product may want to perform testing on the product. Thus, the example IC 702 may perform self-testing in response to a self-test signal 709. In response to the self-test signal 709, the DSP 708 generates digital input codes corresponding to a sine wave, ramp wave, or triangle wave as described above, and applies the digital input codes to the DAC channels A 712 and B 714. The analog representations generated by the DAC channels A 712 and B 714 in response to the digital input codes are compared by the error detector 706, which outputs a flag 711 indicative of whether the DAC channels A 712 and B 714 are operating within design specifications. The flag 711 may be read by any type of tester 710 or indicator device.

To expedite self-testing, the DSP 708 may access stored tuning information from the storage block 716 and use the tuning information to adjust the digital input codes accordingly. For example, if the storage block 716 contains data to tune channel B 714, the DSP 708 may initially adjust the digital input codes to channel B 714. If the tuning information (or lack of tuning information) correctly indicates the phase relationship between the channels A 712 and B 714, the error detector 706 will detect the DAC 706 is operating within design specifications. If the tuning information incorrectly indicates the phase relationship between the channels A 712 and B 714, the error detector 706 will detect the DAC 706 in not operating within specifications, and the DSP 708 may attempt to tune the DAC 706 by, for example, executing the example process 500 described in FIG. 5.

Figure 8:
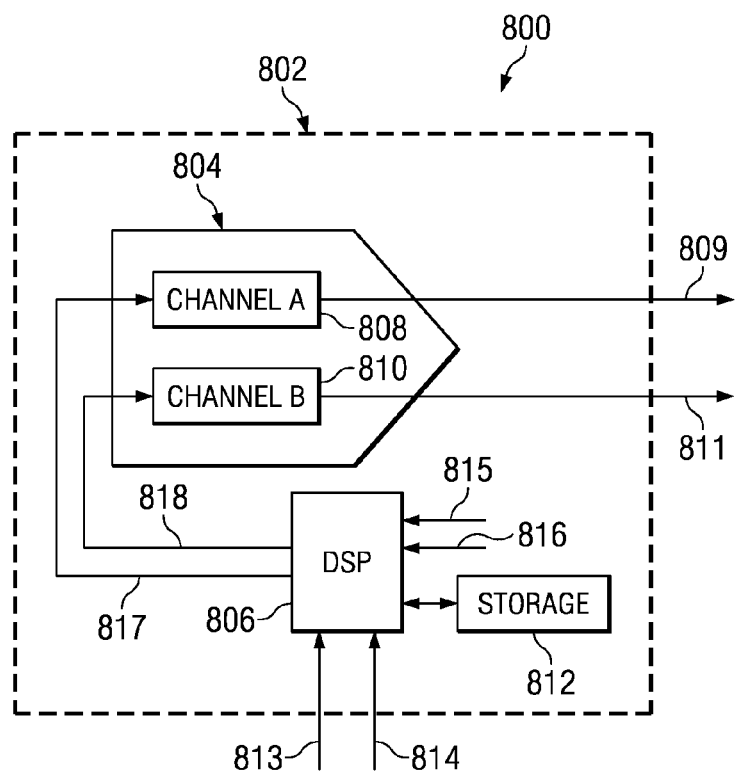
FIG. 8 is a block diagram of an example integrated circuit provided with a multi-channel digital-to-analog converter and a digital signal processor, implemented in an example customer application.

FIG. 8 is a block diagram of an example IC 802 provided with a multi-channel DAC 804 and a digital signal processor 806, implemented in an example customer application 800. The example IC 802 is implemented in the example customer application 800 after being tested during manufacturing as described above. In the example customer application 800, the DAC 804 receives digital codes on at least one of the example channels A 808 or B 810, and outputs an analog representation 809 and/or 811 from the channel(s) that receive digital codes. The analog representations 809 and/or 811 may be used by other circuits or logic within the IC 802, or may be provided to external devices.

During operation of the example IC 802, the DSP 806 receives digital codes 813, 814, 815, and/or 816 to be converted to analog representations by the DAC 804. The digital codes 813 and 814 may be received from, for example, circuits or sensors outside the IC 802. Additionally or alternatively, digital codes 815 and 816 may be received from circuits or sensors within the IC 802, depending on the IC 802 application. When receiving the digital codes 813-816, the DSP 806 determines whether the digital codes must be adjusted due to, for example, tuning information determined during manufacturing testing. The DSP 806 accesses tuning information stored in the storage block 812, and applies the tuning information (if available) to the received digital codes 813-816. The DSP 806 then sends adjusted digital codes 817 and/or 818 to the respective DAC channels A 808 and/or B 810. The DAC channels A 808 and/or B 810 generate analog representations based on the adjusted digital codes 817 and/or 818, respectively, and output the analog representations 809 and/or 811 to internal or external circuitry according to the customer application 800.

Although the example IC 802 of FIG. 7 does not show an error detector as described above in the ICs 402 and 602, the example IC 802 includes an error detector for manufacturing testing and for built-in self-testing as described above. In some examples, an error detector in the IC 802 may also monitor the analog representations 809 and 811 during operation of the IC and output a flag indicative of whether the analog representations 809 and 811 are operating within design specifications.

The described examples are useful in quickly and efficiently testing manufactured multi-channel DACs. Because the test output is a one-bit flag, the external testing equipment may be less complex. Testers may be more easily built or purchased and located in multiple manufacturing facilities. The ability to build and test in multiple locations may further decrease manufacturing costs. Other described examples quickly and efficiently test manufactured multi-channel DACs and optimize potentially faulty ICs. Overall, the described examples increase the total manufacturing yield of ICs, reduce the complexity of testing equipment, increase testing speed and efficiency, and permit testing to be performed in more locations. Each of these factors can reduce the costs associated with manufacturing multi-channel DACs.

Although certain example methods and apparatus are described herein, other implementations are possible. The scope of coverage of this patent is not limited to the specific examples described herein. On the contrary, this patent covers all methods and apparatus falling within the scope of the invention.

What is claimed is:

1. A circuit comprising:
    a multi-channel digital-to-analog converter (DAC) implemented in an integrated circuit, the multi-channel DAC comprising:
        a first DAC channel that is configured to generate a first analog representation of a digital input signal, and
        a second DAC channel that is configured to generate a second analog representation of the digital input signal; and
    an error detector that is configured to compare the first analog representation and the second analog representation to generate a difference signal and to output a signal indicative of whether the difference signal is greater than a predetermined threshold, wherein the error detector is configured to compensate the second analog representation based on a phase relationship between the first DAC channel and the second DAC channel.

2. The circuit of claim 1, further comprising a processing unit configured to monitor the error detector output signal and to tune one of the first DAC channel or the second DAC channel based on the error detector output signal.

3. The circuit of claim 2, wherein the processing unit is configured to generate the digital input signal.

4. The circuit of claim 2, wherein the processing unit comprises a digital signal processor.

5. The circuit of claim 1, wherein the digital input signal is at least one of a digital ramp wave, a digital sine wave, or a digital triangle wave.

6. The circuit of claim 1, wherein the processing unit is configured to tune the second analog representation in response to the error detector output signal.

7. The circuit of claim 6, wherein the processing circuit is configured to tune by adjusting a phase relationship between the first DAC channel and the second DAC channel.

8. The circuit of claim 1, wherein the error detector output signal indicates the multi-channel DAC is faulty when the difference is greater than the predetermined threshold.

9. A method to test a multi-channel DAC, comprising:
applying a test signal to a first DAC channel to generate a first analog representation and a second DAC channel to generate a second analog representation;
determining a phase relationship between the first and second analog representations;
determining if the phase relationship is within a tolerance;
determining the multi-channel DAC is acceptable if the phase relationship is within the tolerance;
compensating for a phase mismatch if the phase relationship is not within the tolerance; and
storing the phase relationship in response to compensating the test signal and determining the phase relationship is within the tolerance.

10. The method of claim 9, wherein the test signal is at least one of a digital sine wave, a digital ramp wave, or a digital triangle wave.

11. The method of claim 9, wherein compensating for the phase mismatch comprises adjusting a phase of the test signal for one of the first DAC channel or the second DAC channel.

12. The method of claim 11, wherein adjusting the phase of the test signal is based on an analog difference signal indicative of the phase relationship.

13. The method of claim 9, further comprising receiving a self-test signal, and wherein applying the test signal is in response to the self-test signal.

14. The method of claim 9, wherein the first DAC channel and the second DAC channel have a pre-defined phase relationship.

15. The method of claim 9, wherein determining a phase relationship comprises determining a difference between the first analog representation and the second analog representation.

16. The method of claim 15, wherein determining the phase relationship comprises compensating for a pre-determined phase relationship.

17. The method of claim 15, wherein determining if the phase relationship is within the tolerance comprises comparing the difference to a threshold.

18. The method of claim 9, wherein the test signal has a first frequency, and further comprising:
applying a second test signal having a second frequency to the first DAC channel to generate a third analog representation and to the second DAC channel to generate a fourth analog representation;
determining a second phase relationship between the third analog representation and the fourth analog representation;
determining if the second phase relationship is within the tolerance; and
determining the multi-channel DAC is unacceptable in response to determining the second phase relationship is not within the tolerance.

19. A system to test a multi-channel DAC, comprising:
a first DAC channel that is configured to generate a first analog representation based on a first digital input signal;
a second DAC channel that is configured to generate a second analog representation based on the first digital input signal;
a phase compensator that is configured to generate a compensated analog representation based on the second analog representation to compensate for a phase difference between the first analog representation and the second analog representation;
an error amplifier that is configured to generate a difference signal based on the first analog representation and the compensated analog representation;
a comparator that is configured to determine whether an amplitude of the difference signal is greater than a threshold;
a processing unit that is configured to:
generate the first digital input signal;
apply the first digital input signal to the first DAC channel and the second DAC channel;
generate a second digital input signal by adjusting a phase of the first test input signal in response to the comparator determining the amplitude of the difference signal is greater than the threshold; and
apply the second digital input signal to one of the first DAC channel or the second DAC channel; and
a test system that is configured to determine whether the DAC is acceptable based on the comparator.

* * * * *